US011115043B1

(12) United States Patent
Simon et al.

(10) Patent No.: US 11,115,043 B1
(45) Date of Patent: Sep. 7, 2021

(54) DIGITAL-TO-ANALOG CONVERSION DEVICE AND DIGITAL-TO-ANALOG CONVERSION SYSTEM

(71) Applicant: Rohde & Schwarz GmbH & Co. KG, Munich (DE)

(72) Inventors: Martin Simon, Otterfing (DE); Bernhard Soehl, Sankt Wolfgang (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 0 days.

(21) Appl. No.: 17/083,623

(22) Filed: Oct. 29, 2020

(51) Int. Cl.
*H03M 1/66* (2006.01)
*H03M 1/74* (2006.01)

(52) U.S. Cl.
CPC .................... *H03M 1/74* (2013.01)

(58) Field of Classification Search
CPC ................. H03M 1/74; H03M 1/66
USPC ......................................... 341/144
See application file for complete search history.

(56) References Cited

U.S. PATENT DOCUMENTS

| | | | | |
|---|---|---|---|---|
| 5,585,794 A | * | 12/1996 | Airoldi | H03H 17/028 341/61 |
| 5,748,126 A | * | 5/1998 | Ma | G06J 1/00 341/143 |
| 5,815,419 A | * | 9/1998 | Fujitomi | G06T 3/4007 708/290 |
| 7,345,612 B2 | * | 3/2008 | Eloranta | H03C 1/50 341/144 |
| 9,258,004 B2 | * | 2/2016 | Kappes | H03M 1/005 |
| 10,644,656 B2 | | 5/2020 | de Vreede et al. | |
| 2007/0182617 A1 | * | 8/2007 | Eloranta | H04B 1/30 341/155 |

FOREIGN PATENT DOCUMENTS

EP 0221290 A2 5/1987
EP 0222999 A2 5/1987

* cited by examiner

*Primary Examiner* — Jean B Jeanglaude
(74) *Attorney, Agent, or Firm* — Westman, Champlin & Koehler, P.A.

(57) ABSTRACT

A digital-to-analog conversion device and a digital-to-analog conversion system with multiple digital-to-analog conversion cores is provided. At least some of the multiple digital-to-analog conversion cores may be operated with different clock signals, especially with clock signals of different clock frequencies. For this purpose, each digital-to-analog conversion stage is provided with multiple different clock signals and each stage individually selects one of the multiple clock signals.

16 Claims, 3 Drawing Sheets

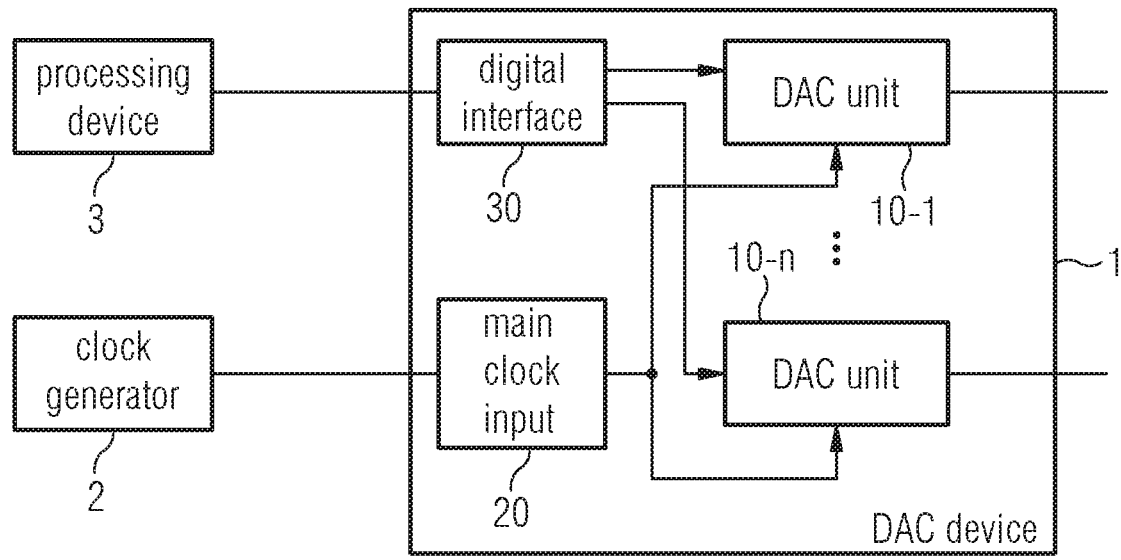
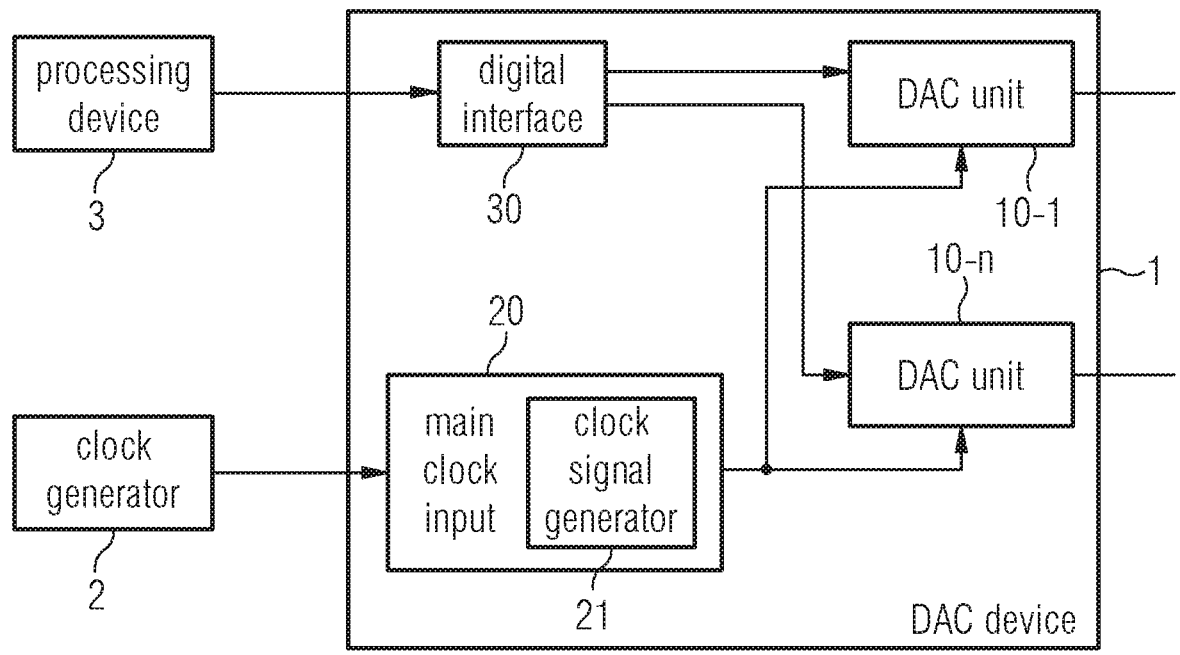

DIGITAL-TO-ANALOG CONVERSION DEVICE AND DIGITAL-TO-ANALOG CONVERSION SYSTEM

TECHNICAL FIELD

The present invention relates to a digital-to-analog conversion device. The present invention further relates to a digital-to-analog conversion system.

BACKGROUND

Even though applicable in general to any digital-to-analog converter with multiple digital-to-analog conversion units, the present invention and its underlying problem will be hereinafter described in connection with a digital-to-analog conversion (DAC) chip comprising multiple DAC cores.

DACs may be used for converting digital samples to corresponding analog signals. When converting digital signals, in particular digital radio frequency signals, to analog signals, there exists a restricted frequency area in a range of the half sampling rate.

Furthermore, there exist DAC devices with multiple DAC cores. Accordingly, each DAC core of such a DAC device may perform a separate digital-to-analog conversion. However, all DAC cores of such devices are operated with a same frequency. Thus, the output signals of all DAC cores may have a same restricted frequency range.

Against this background, there is a need for an improved DAC device with multiple DAC cores which may overcome the problem of a common restricted frequency range for all DAC cores.

SUMMARY

The present invention provides a digital-to-analog conversion device and a digital-to-analog conversion system with the features of the independent claims. Further advantageous embodiments are subject matter of the dependent claims.

According to a first aspect of the present invention, a digital-to-analog conversion device is provided. The digital-to-analog conversion device comprises a main clock input and multiple digital-to-analog conversion units. The main clock input is configured to receive one or more main clock signals. The main clock input is further configured to provide at least two clock signals based on the received one or more main clock signals. In particular, each of the at least two provided clock signals may have a different clock frequency. Each of the multiple digital-to-analog conversion units may comprise at least two clock inputs, a digital input, an interpolator and a digital-to-analog core. Each of the at least two clock inputs is configured to receive the at least two clock signals provided by the main clock input. The digital input is configured to receive a digital data signal. The digital data signal may have a predetermined input data rate. The interpolator is configured to interpolate the digital data signal received by the digital input. In particular, the interpolator may interpolate the received digital data signal by a predetermined interpolation factor. The result of this interpolation may be output as interpolated digital data signal. The digital-to-analog core is configured to receive the interpolated digital data signal. The digital-to-analog core further is configured to convert the received interpolated digital data signal to an analog signal. The conversion of the interpolated digital data signal to the analog signal is performed according to one of the clock signals received by the at least two clock inputs.

According to a further aspect, a digital-to-analog conversion system is provided. The digital-to-analog conversion system comprises a digital-to-analog conversion device and a clock generator. The digital-to-analog conversion device may be a digital-to-analog conversion device according to the first aspect. The clock generator is configured to generate at least one main clock signal. The generated at least one main clock signal may be provided by the clock generator to the main clock input of the digital-to-analog conversion device.

The present invention is based on the finding that there exists a restricted frequency range when converting frequency signals, in particular radio frequency signals from a digital to an analog domain. This restricted frequency range may be in an area in the range of the half sampling rate. Accordingly, when operating multiple digital-to-analog converters with a same clock rate, the output of all digital-to-analog converters may also have a same restricted frequency range. Hence, a problem arises for frequency signals covering such a restricted frequency area. Especially, changing the common clock frequency of all digital-to-analog converters to another clock frequency may only shift the problem of the common restricted frequency area to another frequency area for all digital-to-analog converters.

The present invention takes into account this finding and aims to provide a digital-to-analog conversion device which may overcome the problem of a common restricted frequency range in a frequency area of half of a sampling rate. It is for this purpose that multiple digital-to-analog conversion cores of a DAC may be provided with multiple—at least two—different clock frequencies. Especially, each of the DAC cores may be provided with the at least two different clock signals in parallel. Accordingly, each DAC core may select one of the provided clock signals individually. In this way, different DAC cores may use clock signals with different frequencies, and consequently, the output of the DAC cores may have different restricted frequency ranges.

Hence, depending on the desired application, each DAC core may use an individual appropriate clock signal. For example, each DAC core may be operated with a clock signal which shifts the restricted frequency area to an area which does not cover the related frequency range. Furthermore, a broadband signal may be generated by two DAC cores operating with different clock frequencies, and consequently having different restricted frequency areas. By combining the output of two or more DAC cores, a broadband signal can be obtained without a gap due to a restricted frequency area.

The digital-to-analog conversion (DAC) device of the present invention comprises multiple DAC cores for performing a digital-to-analog conversion. By providing multiple clock signals with different clock frequencies to each DAC core, each DAC core may individually select one of the multiple clock signals for performing the digital-to-analog conversion. In this way, the individual DAC cores may perform digital-to-analog conversions based on different clock signals. Since clock signals with different frequencies lead to different restricted frequency areas in the analog output, each DAC unit may be individually configured with respect to the resulting restricted frequency area.

The interpolator and/or the DAC cores of the multiple digital-to-analog conversion units may be any kind of appropriate elements. For example, conventional interpolators and/or DAC cores may be used. For instance, such interpolators/DAC cores may be interpolators/DAC cores as used, for example, by an AD9082 chip of Analog Devices. However, it is understood that any other appropriate kind of interpolator or digital-to-analog core may be also possible.

In contrast to conventional DAC devices which usually only have a single input for receiving a single clock signal and use this single clock signal by all DAC cores, the DAC device according to the present invention uses at least two different clock signals in parallel. Especially, the at least two clock signals may be provided to each of the multiple DAC units, and each DAC unit individually may select an appropriate one of the at least two provided clock signals. In this way, each DAC core of the multiple DAC units may perform a digital-to-analog conversion based on an individually selected clock signal. Thus, it is possible to perform digital-to-analog conversions based on different clock frequencies.

For this purpose, each DAC unit of the DAC device may comprise a clock input for receiving multiple clock signals in parallel. The clock inputs of the DAC units may comprise multiple input ports. Each input port may receive one of the at least two clock signals. Further, the DAC units may be controlled such that each DAC unit individually selects one of the clock signals provided at the respective clock inputs and provides the selected clock signal to the DAC core. Furthermore, the interpolation factor of the related interpolator of the respective DAC unit may be also controlled such that the interpolation result corresponds to the requirements of the related DAC core operating with the selected clock signal.

The at least two clock signals which are provided to each of the multiple DAC units may be provided from one or more external clock generators to a main clock input of the DAC device. In such a case, the externally generated clock signals may be directly provided to the clock input of the DAC units. Alternatively, it may be also possible to receive only a single reference clock signal and to generate the required clock signals for the DAC units within the DAC device. This will be described in more detail below.

Accordingly, the DAC device may obtain multiple digital signals. Each of the received digital signals may be separately converted to an analog signal by one of the DAC units. For this purpose, each of the DAC units may individually select one of the multiple clock signals provided to each of the DAC units.

Even though the individual DAC cores of the DAC units may be operated with different frequencies, the digital signals may be provided to each of the DAC units by a same data rate. Accordingly, the interpolators of the multiple DAC units may interpolate the received digital data signals by appropriate interpolation factors such that the interpolated output of the interpolators fits to the frequency of the clock signal used by the related DAC core. In this way, the digital data may be provided to the DAC device by a common data rate, even if the individual DAC cores are operated by different clock frequencies.

Further embodiments of the present invention are subject of the further sub-claims and of the following description, referring to the drawings.

In a possible embodiment, each of the multiple digital-to-analog conversion units comprises a selector. The selector may be configured to receive the at least two clock signals. The selector may further select one of the at least two clock signals and provide the selected clock signal to the related digital-to-analog core.

For example, the selector may comprise a switching element or the like for selecting one of the provided at least two clock signals. The selector, in particular the switch, may be controlled, for example, by a control unit of the respective DAC unit or a common control unit of the DAC device. Furthermore, it may be also possible to control the operation of the selector based on a control signal provided by a remote device.

Furthermore, it may be also possible to control the operation of the interpolator, in particular a selection of an appropriate interpolation factor, in line with the selection of the clock signal. In this way, the result of the interpolator, i.e. the interpolated digital data signal, may match to the frequency of the clock signal selected by the respective selector.

In a possible embodiment, the main clock input is configured to receive at least two main clock signals. Accordingly, the main clock input may be configured to provide the received at least two main clock signals directly to the at least two clock inputs of the multiple digital-to-analog conversion units. Accordingly, the clock signals which are provided to each of the DAC units are generated externally by one or more clock generators. The clock signals provided by the external clock generators are forwarded to the clock inputs of each DAC unit. In this way, a very simple configuration can be achieved.

In a possible embodiment, the main clock input is configured to receive only a single main clock signal. The main clock input may comprise a clock signal generator. The clock signal generator of the main clock input generates the at least two clock signals based on the received main clock signal. Further, the main clock input is configured to provide the generated at least two clock signals to each of the at least two clock inputs of the multiple digital-to-analog conversion units. Accordingly, the required clock signals which are provided to each of the DAC units are generated within the DAC device based on a single reference signal provided to the main clock input. In this way, the requirements for providing external signals can be reduced.

In a possible embodiment, the clock signal generator of the main clock input comprises a number of one or more frequency multipliers. Additionally or alternatively, the clock signal generator of the main clock input may comprise a number of one or more frequency dividers. Accordingly, the clock signal generator may be configured to generate the at least two clock signals by multiplying and/or dividing one or more reference signals provided to the main clock input. For example, the at least two clock signals may be obtained by multiplying a frequency of a reference signal by different multiplication factors. It may be also possible to obtain clock signals by dividing a clock signal by different numbers. Furthermore, it may be also possible to use a chain of frequency multipliers and/or frequency dividers in order to obtain the at least two clock signals.

In a possible embodiment, the at least two clock inputs are configured to receive clock signals having a frequency ratio of 4/3 or a frequency ratio of 3/2. However, any other frequency ratio, in particular a frequency ratio of two positive integer numbers, may be also possible. Such frequency ratios can be easily obtained by multiplying a reference clock signal by different multiplication factors according to the desired frequency ratio. However, any other manner for obtaining the respective clock signals may be also possible. By using clock signals having such a frequency ratio of two positive integer numbers, the related interpolators can easily be configured by considering the respective frequency ratio. Especially, the interpolation of digital data signals provided by a common data rate to the desired interpolated output can be easily achieved.

In a possible embodiment, the predetermined interpolation factor of each interpolator can be set individually. Especially, the interpolation factor of each interpolator is set according to a frequency of the clock signals used by the related digital-to-analog core for converting the interpolated digital data signal. Especially by adapting the interpolation factor of the interpolators related to a DAC core to the frequency of the clock signal used by the respective DAC core, it is possible to use a common data rate for providing digital data to all DAC units. In this way, providing of the data for the digital data signals to the individual DAC units can be simplified. For example, the external device providing the data for all DAC units may require one common data rate for providing all data signals.

In a possible embodiment, each digital input of the multiple digital-to-analog conversion units is configured to receive the digital data signal with a same data rate. Accordingly, the digital data for all DAC units can be provided, for example, by a common processing device such as a field programmable gate array (FPGA) or the like. For example, the digital data for all or at least some of the DAC units may be provided by a single communication link to the DAC device. Hence, it is not necessary to change the properties of the communication between the DAC device and a remote device for providing digital data to multiple DAC units.

In a possible embodiment, the DAC device comprises a digital interface. The digital interface may be configured to communicatively couple the digital inputs of the multiple DAC units with a remote interface. For example, the remote interface may be a digital interface of a remote processing device for providing the digital data signals. Accordingly, the digital data signals for all DAC units may be provided via this digital interface from a remote device.

In a possible embodiment, the DAC device is implemented on a single chip. In particular, the DAC device may be implemented on a semiconductor chip.

In a possible embodiment of the digital-to-analog conversion system, the clock generator is configured to generate at least two main clock signals. In this case, the clock generator may provide the at least two generated main clock signals to the main clock input of the digital-to-analog conversion device. Accordingly, the DAC conversion device may comprise separate input terminals for receiving the at least two main clock signals. Especially, each of the at least two generated main clock signals may have a different clock frequency.

In a possible embodiment, the at least two main clock signals may have a frequency ratio of 3/4 or 2/3. However, any other appropriate ratio, in particular any appropriate ratio of two positive integer numbers may be possible, too.

In a possible embodiment, the DAC system comprises a signal processing device. The signal processing device may be configured to generate multiple data signals. Accordingly, the signal processing device may provide one of the multiple data signals to one of the multiple DAC conversion units, respectively. The signal processing device may be configured to provide the multiple data signals to the DAC conversion units with a same data rate.

In a possible embodiment, the DAC conversion system may further comprise a combiner. The combiner may be configured to combine at least two of the analog signals provided by the digital-to-analog cores of the multiple digital-to-analog conversion units. Accordingly, analog signals from DAC units operating with different clock frequencies may be combined. In this case, the resulting analog signals may have different restricted frequency areas. By combining the analog output of multiple DAC units, the required frequency components of one DAC unit may be covered by an output of another DAC unit. In this way, a broadband signal covering a wide frequency range without a restricted frequency area can be generated.

With the present invention it is therefore possible, to operate a digital-to-analog conversion device with multiple different clock frequencies. For this purpose, each DAC unit may be provided with clock signals relating to different frequencies, and each DAC unit may individually select one of the provided multiple clock signals. Accordingly, each DAC unit may be configured individually depending on the required constraints such as resulting restricted frequency area or the like.

BRIEF DESCRIPTION OF THE DRAWINGS

For a more complete understanding of the present invention and advantages thereof, reference is now made to the following description taking in conjunction with the accompanying drawings. The invention is explained in more detail below using exemplary embodiments, which are specified in the schematic figures and the drawings, in which:

FIG. 2: shows a schematic block diagram of a digital-to-analog conversion system with a DAC device according to an embodiment;

FIG. 3: shows a schematic block diagram of a DAC system according to another embodiment.

DESCRIPTION OF EMBODIMENTS

Figure 1:
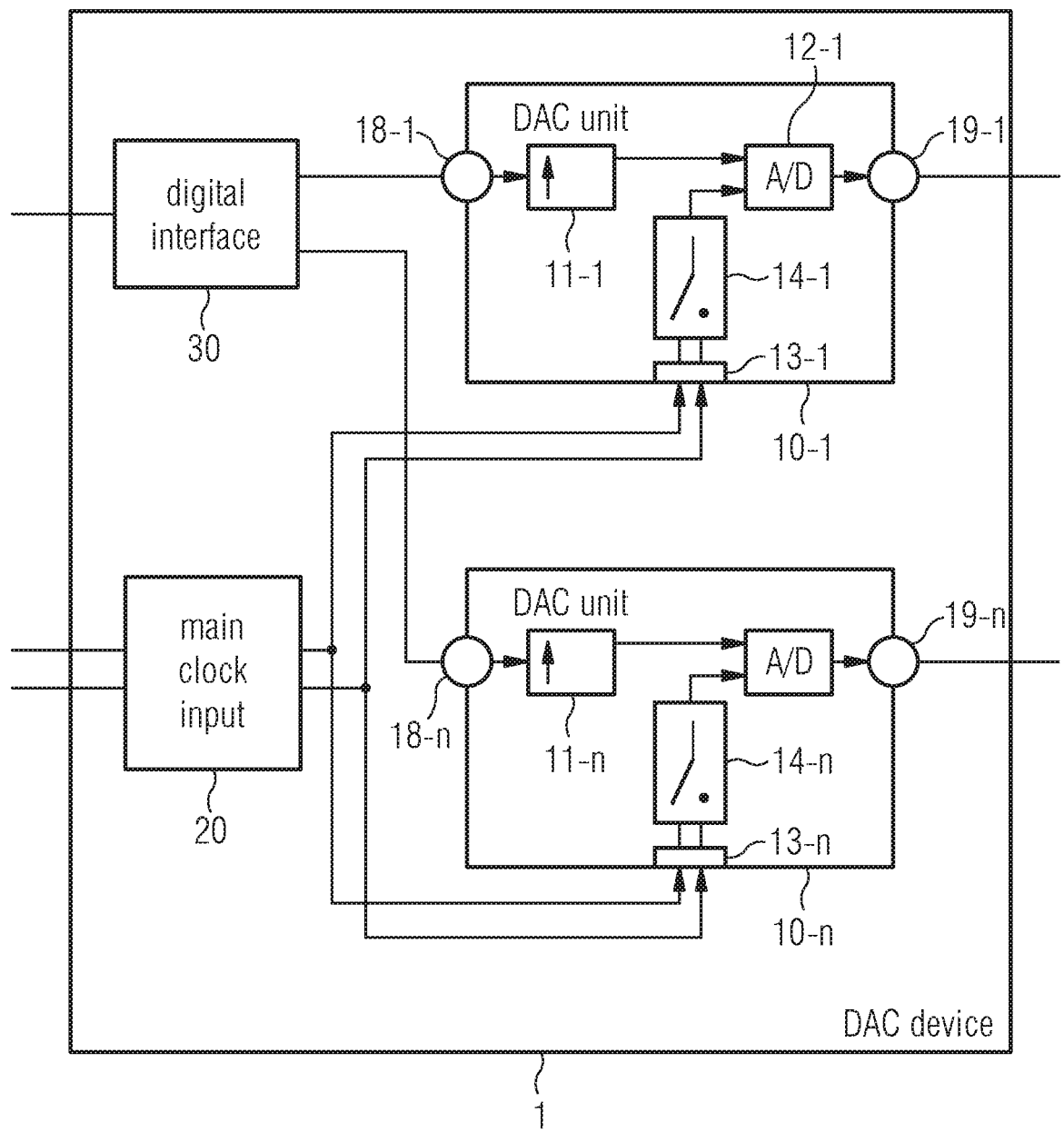
FIG. 1: shows a schematic block diagram of a digital-to-analog conversion device according to an embodiment.

FIG. 1 shows a schematic block diagram of a digital-to-analog conversion (DAC) device 1 according to an embodiment. The DAC device 1 comprises a digital interface 30, a main clock input 20 and multiple digital-to-analog conversion units 10-$i$. Each DAC unit 1 comprises at least an interpolator 11-$i$, a DAC core 12-$i$ and a clock input 13-$i$. Further, each DAC core 10-$i$ may comprise a selector 14-$i$.

The digital interface 30 may receive digital data relating to one or more digital signals which are to be converted to analog signals by the DAC units 10-$i$. For this purpose, the digital interface 30 may be communicatively coupled with a remote device, for example a remote processing device which provides the digital data of the respective digital signals. For example, the remote device may be a field programmable gate array (FPGA) or any other appropriate processing device. For example, the remote device may comprise a digital signal processor for generating the required digital data. Further, the remote device may comprise an interface which is communicatively coupled with the digital interface 30 of the DAC device 1. However, any other appropriate device for providing the required data comprising the digital signals may be also possible.

The main clock input 20 receives one or more clock signals from remote a clock generator. For this purpose, the main clock input may comprise an appropriate number of input terminals which may be coupled with one or more remote clock generators. The remote clock generator may provide, for example, a number of separate clock signals to the main clock input 20. Each of the multiple clock signals may have a different clock frequency. For example, a ratio between the individual frequencies of the multiple signals provided by the remote clock generator may have a predetermined frequency ratio. The multiple clock signals which are received by the main clock input from the remote clock may be forwarded to the clock inputs 13-$i$ of the multiple DAC units 10-$i$. Especially, the clock signals received by the main clock input 20 may be forwarded directly to the clock inputs 13-$i$ of the DAC units 10-$i$.

Alternatively, it may be also possible that the main clock input 20 comprises appropriate devices for increasing or decreasing the frequencies of clock signals received from a remote clock generator. For example, frequency multipliers and/or frequency dividers may be used for changing the frequency of a received clock signal before forwarding the clock signal to the clock inputs 13-$i$ of the DAC units 10-$i$.

For example, it may be possible to receive only a single reference clock signal from the remote clock generator by the main clock input 20 and to generate multiple clock signals with different clock frequencies based on the received reference clock signal. For this purpose, frequency multipliers or frequency dividers may be used. The generation of multiple clock signals based on a received reference clock signal will be described in more detail below.

Accordingly, each DAC unit 10-$i$ may be provided with a digital data signal which shall be converted to an analog signal by the respective DAC unit 10-$i$, and further with at least two clock signals, especially two clock signals having different clock frequencies. Each DAC unit 10-$i$ may select one of the at least two clock signals and perform a digital-to-analog conversion of the received digital signal based on the selected clock signal. Since each DAC unit 10-$i$ may individually select one of the provided at least two clock signals, the DAC units 10-$i$ may perform the digital-to-analog conversion based on different clock signals, and consequently based on different clock frequencies.

The digital signal provided to a digital input 18-$i$ of DAC 10 is forwarded to an interpolator 11-$i$. The interpolator 11-$i$ may interpolate the digital data signal by a predetermined interpolation factor. Accordingly, the digital data signal is interpolated to an interpolated digital signal which is appropriate for the successive digital-to-analog conversion based on the respective clock signal. For this, the interpolated digital signal is provided to a DAC core 12-$i$ of the DAC unit 10-$i$. Further, one of the clock signals provided to the respective clock input 13-$i$ is selected and also provided to the DAC core 12-$i$. For example, a selector 14-$i$ may select one of the clock signals received by clock input 13-$i$ and forward the selected clock signal to the DAC core 12-$i$. For example, the selector 14-$i$ may comprise a switch element or the like for selecting one of the clock signals.

The selection of an appropriate clock signal by the switching element and the corresponding determination of an appropriate interpolation factor which is applied by interpolator 11-$i$ may be controlled in any appropriate manner. For example, the selection of the clock signal and/or the interpolation factor may be specified by the data which are provided by the data signal received at digital input 18-$i$. However, it may be also possible to provide one or more appropriate further control signals in order to specify the selection of the desired clock signal and/or the interpolation factor. Furthermore, each DAC unit 10-$i$ may comprise a control unit (not shown) for controlling the selection of the clock signal and/or the determination of the interpolation factor. Alternatively, a central control device may be provided in the DAC device 1 for controlling the selection of the clock signal and/or the determination of the interpolation factors. Furthermore, the respective information may be provided from a remote device by the digital data received by the digital interface 30 or by a further control signal.

DAC core 12-$i$ receives the interpolated digital signal from interpolator 11-$i$ and one of the at least two clock signals and performs a digital-to-analog conversion of the digital data signal. The resulting analog signal may be output by an analog output 19-$i$ connected to the DAC core 12-$i$.

The above described configuration of the DAC device 1 with the multiple DAC units 10-$i$ may be realized, for example, on a common chip, in particular a semiconductor chip. In this way, a single chip with multiple digital-to-analog converters is provided, wherein a clock frequency of a clock signal for performing the digital-to-analog conversion of each DAC core 12-$i$ may be selected individually. Thus, it is not necessary to operate all DAC cores 12-$i$ with a same clock frequency.

In the above described example according to FIG. 1, only two DAC units 10-$i$ are shown. However, it is understood, that the present invention is not limited to only a DAC device 1 with only two DAC units 10-$i$. Moreover, any other appropriate number of DAC units 10-$i$, for example 4 DAC units 10-1, 8 DAC units 10-$i$ or even 16 DAC units 10-$i$ may be possible. However any other number of DAC units 10-$i$ may be also possible.

In the following an example of possible data rates, clock frequencies and interpolation factors is provided. However, this example only serves for a better understanding of the invention and does not limit the present invention in any manner.

For example, the digital interface 30 of the DAC device 1 may receive the digital data of the multiple digital signals with a data rate of 750 MHz. Accordingly, the values of the digital signals which are to be converted into analog signals are received with a data rate of 750 MHz from a remote device. The digital data may be provided by any appropriate manner, for example by a serial or parallel communication link.

Further, the clock inputs 13-$i$ of the DAC units 10-$i$ are provided with two clock signals. A first clock signal may have a clock frequency of 9 GHz and a second clock signal may have a clock frequency of 12 GHz. Accordingly, due to the Nyquist criterion, a digital-to-analog conversion with a clock rate of 9 GHz may have a restricted frequency area in the range of half the clock frequency, i.e. 4.5 GHz. For example, the restricted frequency range may be between 4.05 GHz and 4.95 GHz. Accordingly, the restricted frequency range of a digital-to-analog conversion with a clock frequency of 12 GHz may have a restricted frequency range by the half of 12 GHz, i.e. 6 GHz. For example, the restricted frequency range in case of 12 GHz may be between 5.4 GHz and 6.6 GHz. Thus, depending on the frequency components of the digital data signal, an appropriate clock signal may be selected. In particular, the restricted frequency area in the range of half of the clock frequency may be considered when selecting the individual clock signals.

In order to obtain appropriate digital data for a digital-to-analog conversion based on a clock frequency of 9 GHz or 12 GHz, the digital data signals which is received with a data rate of 750 MHz, have to be interpolated appropriately. For example, the digital data with a data rate of 750 MHz may be interpolated by an interpolation factor of 12 in order to obtain interpolated data which are appropriate for a digital-to-analog conversion with a clock signal of 9 GHz. Accordingly, the digital data which are provided with a data rate of 750 MHz may be interpolated with an interpolation factor of 16 in order to obtain digital data which are appropriate for an digital-to-analog conversion with a clock frequency of 12 GHz.

As can be seen from this example, the digital data of the multiple digital data signals may be provided with a same data rate and interpolated with appropriate interpolation factors in order to perform a digital-to-analog conversion with clock rates of different frequencies.

FIG. 2 shows a block diagram of a digital-to-analog conversion system according to an embodiment. The DAC system may comprise, for example, a DAC device 1 as already described above. As can be further seen in FIG. 2, the DAC system may comprise a clock generator 2. Clock generator 2 may generate one or more clock signals. For example, clock generator 2 may generate clock signals by means of a phased locked loop (PLL) signal generator. As already mentioned above, signal generator 2 may generate a single reference signal, which is provided to a main clock input 20 of the DAC device 1. In this case, the DAC device 1 may generate multiple clock signals based on the provided reference clock signal.

Alternatively, clock generator 2 may generate multiple clock signals and provide the multiple clock signals to the main clock input 20 of the DAC device 1. For example, the multiple clock signals may be provided from the clock generator 2 to the DAC device 1 by separate signal lines. Especially, the clock generator 2 may generate all clock signals based on a common internal reference clock signal. For example, frequency multipliers and/or frequency dividers may be used in order to derive the multiple clock signals based on the internal clock signal. However, any other manner for generating the multiple clock signals may be possible, too.

Furthermore, the DAC system may comprise a processing device 3 for providing the digital data signals which shall be converted to analog signals by the DAC device 1. For example, the processing device 3 may comprise a digital signal processor, a FPGA or any other appropriate device for generating the digital data of the digital data signals. Furthermore, processing device 3 may also generate additional commands or instructions which may be provided to the DAC device 1 in order to control the operations of the DAC device 1, in particular the selection of the clock signals by selectors 14-$i$ and/or the interpolation factors applied by the interpolators 11-$i$.

Processing device 3 may split the digital data of a desired digital signal into multiple sub-signals and provide each sub-signal to one of the DAC units 10-$i$. After converting the sub-signals to analog signals by multiple DAC units 10-$i$, the resulting analog signals may be combined together to obtain a common analog signal. Since the individual DAC cores 12-$i$ may be operated with clock signals of different clock frequencies, and thus, the restricted frequency areas by about half of the clock frequency are different, a resulting broadband analog signal can be achieved without or at least with reduced impact due to the different restricted frequency areas.

FIG. 3 shows a schematic block diagram of a DAC system according to a further embodiment. The DAC system according to FIG. 3 mainly corresponds to the previously described embodiments. Main clock input 20 differs from the previously described main clock input in that main clock input 20 according to the embodiment of FIG. 3 receives only a single reference clock signal from an external clock generator 2. Main clock input 20 further comprises a clock signal generator 21 for generating multiple clock signals based on the received reference clock signal. For this purpose, clock signal generator 21 may comprise frequency multipliers and/or frequency dividers in order to obtain clock signals with desired clock frequencies. For example, a reference clock signal with a clock frequency of 3 GHz may be received. In this case, a clock signal with a frequency of 9 GHz may be obtained by multiplying the reference clock signal with a factor of 3. Furthermore, a clock signal with a clock frequency of 12 GHz may be obtained by multiplying the reference clock signal of 3 GHz by a factor of 4. However, it is understood, that any other frequency multiplication and/or division may be also performed in order to obtain clock signals with desired frequencies. Accordingly, the multiple clock signals provided by the clock signal generator 21 may be provided to the clock inputs 13-$i$ of the DAC units 10-$i$.

Figure 4:
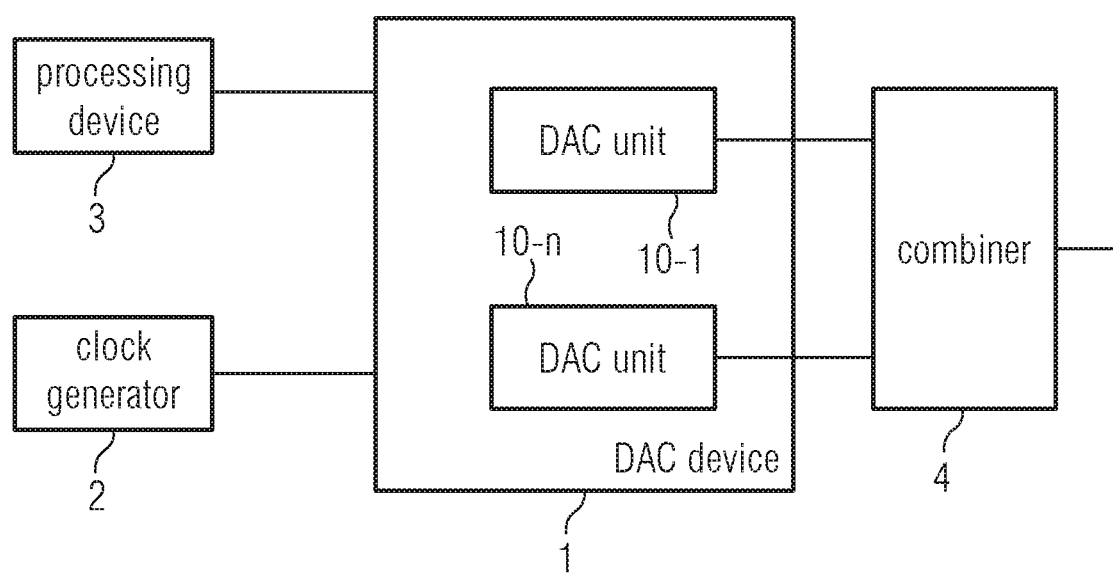
FIG. 4: shows a schematic block diagram of a DAC system according to still another embodiment.

FIG. 4 shows a schematic block diagram of still a further embodiment of a DAC system. Again, the explanations which are provided in connection with the previous embodiments may also be valid for the embodiment according to FIG. 4 as far as applicable.

FIG. 4 further comprises a combiner 4. Combiner 4 may comprise multiple inputs. In particular, the outputs of DAC device 1 for providing the analog signals may be coupled with the inputs of combiner 4. In this way, combiner 4 may provide one or more output signals. Each output signal of combiner 4 may comprise analog signals from two or more DAC units 10-$i$. Combiner 4 may combine analog signals of multiple DAC units 10-$i$, wherein the individual DAC cores 12-$i$ are operated with different clock signals, in particular clock signals with different clock frequencies. Accordingly, combiner 4 may provide a broadband signal. Since at least some of the DAC cores 12-$i$ are operated with different clock signals, the resulting analog signals may have different restricted frequency areas. Hence, by combining multiple analog signals which are generated based on different clock signals, the resulting analog signal does no longer have such a restricted frequency area.

Summarizing, the present invention provides a digital-to-analog conversion device and a digital-to-analog conversion system with multiple digital-to-analog conversion cores. At least some of the multiple digital-to-analog conversion cores may be operated with different clock signals, especially with clock signals of different clock frequencies. For this purpose, each digital-to-analog conversion stage is provided with multiple available different clock signals and may individually select one of the multiple clock signals.

In the foregoing detailed description, various features are grouped together in one or more examples or examples for the purpose of streamlining the disclosure. It is understood that the above description is intended to be illustrative, and not restrictive. It is intended to cover all alternatives, modifications and equivalents as may be included within the scope of the invention. Many other examples will be apparent to one skilled in the art upon reviewing the above specification.

Specific nomenclature used in the foregoing specification is used to provide a thorough understanding of the invention. However, it will be apparent to one skilled in the art in light of the specification provided herein that the specific details are not required in order to practice the invention. Thus, the foregoing descriptions of specific embodiments of the present invention are presented for purposes of illustration and description. They are not intended to be exhaustive or to limit the invention to the precise forms disclosed; obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. Throughout the specification, the terms "including" and "in which" are used as the plain-English equivalents of the respective terms "comprising" and "wherein," respectively. Moreover, the terms "first," "second," and "third," etc., are used merely as labels, and are not intended to impose numerical requirements on or to establish a certain ranking of importance of their objects.

LIST OF REFERENCE SIGNS 1 digital-to-analog conversion device
2 processing device
3 clock generator
4 combiner
10-$i$ digital-to-analog conversion unit
11-$i$ interpolator
12-$i$ digital-to-analog conversion core
13-$i$ clock input
14-$i$ selector
18-$i$ digital input
19-$i$ analog output
20 main clock input
21 clock signal generator
30 digital interface

The invention claimed is:

1. A digital-to-analog conversion device, comprising:
a main clock input for receiving a number of one or more main clock signals and providing at least two clock signals based on the received number of one or more main clock signals, wherein each of the at least two clock signals has a different clock frequency; and
multiple digital-to-analog conversion units, each digital-to-analog conversion unit comprising:
at least two clock inputs for receiving the at least two clock signals provided by the main clock input;
a digital input for receiving a digital data signal;
an interpolator for interpolating the received digital data signal by a predetermined interpolation factor and outputting an interpolated digital data signal; and
a digital-to-analog core for receiving the interpolated digital data signal and converting the received interpolated digital data signal to an analog signal according to one of the clock signals received by the at least two clock inputs.

2. The digital-to-analog conversion device of claim 1, wherein each of multiple digital-to-analog conversion units comprises a selector for receiving the at least two clock signals, selecting one of the at least two clock signals and providing the selected clock signal to the digital-to-analog core of the respective digital-to-analog conversion unit.

3. The digital-to-analog conversion device of claim 1, wherein the main clock input is configured to receive at least two main clock signals and to provide each of the at least two received main clock signals to the at least two clock inputs of the multiple digital-to-analog conversion units.

4. The digital-to-analog conversion device of claim 1, wherein the main clock input is configured to receive a single main clock signal,
the main clock input comprises a clock signal generator for generating the at least two clock signals based on the received main clock signal, and
wherein the main clock input is configured to provide the at least two generated clock signals to the at least two clock inputs of the multiple digital-to-analog conversion units.

5. The digital-to-analog conversion device of claim 4, wherein the clock signal generator of the main clock input comprises a number of one or more frequency multipliers and/or frequency dividers for generating the at least two clock signals.

6. The digital-to-analog conversion device of claim 1, wherein the at least two clock inputs are configured to receive clock signals with a frequency ratio of 4/3 or 3/2.

7. The digital-to-analog conversion device of claim 1, wherein the predetermined interpolation factor of each interpolator is individually set.

8. The digital-to-analog conversion device of claim 7, wherein the interpolation factor of each interpolator is set according to a frequency of the clock signals used by a related digital-to-analog core for converting the interpolated digital data signal.

9. The digital-to-analog conversion device of claim 1, wherein each digital input of the multiple digital-to-analog conversion units is configured to receive the digital data signal with a same data rate.

10. The digital-to-analog conversion device of claim 1, comprising a digital interface for communicatively coupling the digital inputs of the multiple digital-to-analog conversion units with a remote interface.

11. The digital-to-analog conversion device of claim 1, wherein the digital-to-analog conversion device is implemented on a single chip, in particular a single semiconductor chip.

12. A digital-to-analog conversion system, comprising:
a digital-to-analog conversion device, comprising:
a main clock input for receiving a number of one or more main clock signals and providing at least two clock signals based on the received number of one or more main clock signals, wherein each of the at least two clock signals has a different clock frequency; and
multiple digital-to-analog conversion units, each digital-to-analog conversion unit comprising:
at least two clock inputs for receiving the at least two clock signals provided by the main clock input;
a digital input for receiving a digital data signal;
an interpolator for interpolating the received digital data signal by a predetermined interpolation factor and outputting an interpolated digital data signal; and
a digital-to-analog core for receiving the interpolated digital data signal and converting the received interpolated digital data signal to an analog signal according to one of the clock signals received by the at least two clock inputs; and
a clock generator for generating at least one main clock signal and providing the generated at least one main clock signal to the main clock input of the digital-to-analog conversion device.

13. The digital-to-analog conversion system of claim 12, wherein the clock generator is configured to generate at least two main clock signals and to provide the at least two generated main clock signals to the main clock input of the digital-to-analog conversion device,
wherein each of the at least two generated main clock signals has a different clock frequency.

14. The digital-to-analog conversion system of claim 13, wherein the at least two main clock signals have a frequency ratio of 4/3 or 3/2.

15. The digital-to-analog conversion system of claim 12, comprising a signal processing device for generating multiple data signals and providing one of the multiple data signals to a digital-to-analog conversion unit, respectively,
 wherein the signal processing device is configured to provide the multiple data signals to each of the digital-to-analog conversion units with a same data rate.

16. The digital-to-analog conversion system of claim 12, comprising a combiner for combining at least two of the analog signals provided by the digital-to-analog cores of the multiple digital-to-analog conversion units.

* * * * *